United States Patent
Kato (10) Patent No.: US 9,960,512 B2
(45) Date of Patent: May 1, 2018

(54) FLEXIBLE CIRCUIT BOARD AND DEVICE

(71) Applicant: Murata Manufacturing Co., Ltd., Nagaokakyo-shi, Kyoto-fu (JP)

(72) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 105 days.

(21) Appl. No.: 14/845,311

(22) Filed: Sep. 4, 2015

(65) Prior Publication Data

US 2015/0380848 A1    Dec. 31, 2015

Related U.S. Application Data

(63) Continuation of application No. PCT/JP2014/060249, filed on Apr. 9, 2014.

(30) Foreign Application Priority Data

May 13, 2013    (JP) .................................. 2013-101226

(51) Int. Cl.
*H05K 1/00*    (2006.01)
*H01R 12/78*    (2011.01)
(Continued)

(52) U.S. Cl.
CPC ............. *H01R 12/78* (2013.01); *H05K 1/147* (2013.01); *H05K 3/4635* (2013.01); *H05K 1/186* (2013.01); *H05K 3/363* (2013.01); *H05K 3/4617* (2013.01); *H05K 3/4632* (2013.01); *H05K 3/4694* (2013.01); *H05K 2201/0154* (2013.01)

(58) Field of Classification Search
CPC ...... H05K 1/147; H05K 3/4635; H05K 1/148; H05K 1/118; H05K 3/363; H05K 3/361; H05K 3/365; H01R 12/78
See application file for complete search history.

(56) References Cited

U.S. PATENT DOCUMENTS

| | | | | |
|---|---|---|---|---|
| 4,255,613 A | * | 3/1981 | Ketchpel | H05K 3/361 174/117 FF |
| 6,596,947 B1 | * | 7/2003 | Kurita | H05K 1/036 174/251 |

(Continued)

FOREIGN PATENT DOCUMENTS

| | | |
|---|---|---|
| JP | 06-268348 A | 9/1994 |
| JP | 2001-053410 A | 2/2001 |

(Continued)

OTHER PUBLICATIONS

Sony (JP 06-268348) English translation, 1994.*

(Continued)

*Primary Examiner* — Steven T Sawyer
(74) *Attorney, Agent, or Firm* — Keating & Bennett, LLP (57) ABSTRACT

A flexible circuit board whose entire surface has flexibility includes a first substrate portion and a second substrate portion that are adjacent to each other and electrically connected to each other in a planar direction of the flexible circuit board. The first substrate portion includes a plurality of resin layers, which are bonded together with an adhesive, and the second substrate portion includes a plurality of resin layers, which are integrated with one another by intermolecular bonding of a thermoplastic resin.

24 Claims, 5 Drawing Sheets

(51) Int. Cl.
*H05K 1/14* (2006.01)
*H05K 1/18* (2006.01)
*H05K 3/36* (2006.01)
*H05K 3/46* (2006.01)

(56) References Cited

U.S. PATENT DOCUMENTS

| | | | |
|---|---|---|---|
| 2004/0035520 A1 | 2/2004 | Nakamura et al. | |
| 2005/0243528 A1* | 11/2005 | Murayama | H05K 1/148 361/760 |
| 2012/0325524 A1* | 12/2012 | Naganuma | H05K 3/4691 174/254 |

FOREIGN PATENT DOCUMENTS

| | | |
|---|---|---|
| JP | 2003-023248 A | 1/2003 |
| JP | 2007-207782 A | 8/2007 |
| JP | 2007-227856 A | 9/2007 |
| JP | 2008-258357 A | 10/2008 |
| JP | 2011-243895 A | 12/2011 |
| JP | 2012-209383 A | 10/2012 |
| WO | 20081018160 A1 | 2/2008 |

OTHER PUBLICATIONS

Murata (JP 2012-209383) English translation.*
Fujikura LTD (JP 2007-207782) English translation.*
Official Communication issued in International Patent Application No. PCT/JP2014/060249, dated Jul. 15, 2014.

* cited by examiner

FLEXIBLE CIRCUIT BOARD AND DEVICE

BACKGROUND OF THE INVENTION

1. Field of the Invention

The present invention relates to a flexible circuit board whose entire surface has flexibility.

2. Description of the Related Art

A flexible circuit board made of a polyimide is known as a representative example of a flexible circuit board whose entire surface has flexibility. A flexible circuit board made of a polyimide is formed by stacking polyimide films, to each of which a metal film is attached, on top of one another and has an advantage in that it can be manufactured at extremely low cost. However, in a flexible circuit board made of a polyimide, accuracy of electrode shape and accuracy of the flexible circuit board shape are low, and a flexible circuit board made of a polyimide has a disadvantage in that consistently good electrical characteristics are difficult to realize.

Accordingly, a rigid-flexible circuit board only a portion of which has flexibility has sometimes been used (see, for example, Japanese Unexamined Patent Application Publication No. 2008-258357). A rigid-flexible circuit board has a configuration in which a rigid portion and a polyimide portion are connected to each other. In a rigid-flexible circuit board, a polyimide portion ensures flexibility, and a rigid portion ensures a highly accurate shape of an electrode and a highly accurate shape of the rigid-flexible circuit board, so that consistently good electrical characteristics can be realized in the rigid-flexible circuit board. However, such a rigid-flexible circuit board cannot be used in an application that requires a circuit board whose entire surface has flexibility, and it is difficult to reduce the thickness of the entire rigid-flexible circuit board.

Therefore, as a circuit board in which a highly accurate shape of an electrode and a highly accurate shape of a circuit board can be realized, a flexible circuit board made of a thermoplastic resin, such as a liquid crystal polymer resin, has recently attracted more attention than flexible circuit boards made of a polyimide. In a flexible circuit board made of a thermoplastic resin, accuracy of electrode shape and accuracy of the shape of the flexible circuit board made of a thermoplastic resin can easily be improved compared with a flexible circuit board made of a polyimide, and thus, consistently good electrical characteristics can be realized in a flexible circuit board made of a thermoplastic resin. In addition, such a flexible circuit board made of a thermoplastic resin has an advantage in that it does not have the above-mentioned disadvantage.

However, a flexible circuit board made of a thermoplastic resin has lower durability than that of a flexible circuit board made of a polyimide, and thus, in the case where deformation repeatedly occurs in a flexible circuit board made of a thermoplastic resin and in the case where deformation due to a large stress occurs in a flexible circuit board made of a thermoplastic resin, a failure such as fracture of the flexible circuit board made of a thermoplastic resin or breaking of wiring lines has sometimes occurred.

SUMMARY OF THE INVENTION

Accordingly, preferred embodiments of the present invention provide a flexible circuit board whose durability is improved while good electrical characteristics are realized.

A flexible circuit board according to a preferred embodiment of the present invention includes a first substrate portion and a second substrate portion that are adjacent to each other and electrically connected to each other in a planar direction of the flexible circuit board. The first substrate portion includes a plurality of resin layers, which are bonded together with an adhesive, and has flexibility. The second substrate portion includes a plurality of resin layers, which are integrated with one another by intermolecular bonding of a thermoplastic resin, and has flexibility.

In this configuration, the plurality of resin layers of the first substrate portion are bonded together with the adhesive, and thus, the first substrate portion has a higher durability than that in the case where the first substrate portion has a configuration in which a plurality of resin layers are integrated with one another. Therefore, in the case where deformation repeatedly occurs in the flexible circuit board and in the case where deformation due to a large stress occurs in the flexible circuit board, stress sufficient to cause the deformation is absorbed by the first substrate portion, and the occurrence of a failure such as a fracture of the flexible circuit board or breaking of wiring lines is significantly reduced or prevented.

However, in the first substrate portion, accuracy of electrode shape and accuracy of the flexible circuit board shape may sometimes deteriorate and a property of the first substrate portion, such as the dielectric constant, may sometimes vary as a result of swelling of the first substrate portion due to water absorption (moisture absorption) at interfaces between the resin layers and the adhesive and due to water absorption (moisture absorption) by the adhesive. On the other hand, the second substrate portion has a configuration in which the plurality of resin layers are integrated with one another by the intermolecular bonding of the thermoplastic resin, and thus, the adhesive and interfaces that are present between the resin layers are not present in the second substrate portion. Consequently, the second substrate portion has better water resistance (moisture resistance) than that of the first substrate portion, and the accuracy of electrode shape and the accuracy of the flexible circuit board shape is less likely to deteriorate in the second substrate portion, and a property of the second substrate portion, such as the dielectric constant, is stable. Therefore, in the flexible circuit board, a highly accurate shape of the electrode and a highly accurate shape of the flexible circuit board is realized in the second substrate portion, and electrical characteristics of the flexible circuit board are prevented from deteriorating.

Note that it is preferable that at least one of the first substrate portion and the second substrate portion include an interlayer connection conductor extending through the resin layer, and that at least the other one of the first substrate portion and the second substrate portion include a joint conductor that is directly joined to the interlayer connection conductor. With this configuration, interface strength between the first substrate portion and the second substrate portion is improved, and joining of the first and second substrate portions to each other is realized with certainty even though both the first and second substrate portions have flexibility. In addition, the first substrate portion and the second substrate portion are able to be joined to each other at the same time as a process of integrating the plurality of resin layers of the second substrate portion with one another is performed, and the flexible circuit board thus is easily manufactured.

It is preferable that the flexible circuit board include a bonding resin that is bonded to at least a portion of the first substrate portion and at least a portion of the second substrate portion. With this configuration, the interface strength between the first substrate portion and the second substrate portion is improved.

It is preferable that portions of the plurality of resin layers of the first substrate portion be separated from each other, and that the second substrate portion be sandwiched between the portions. In particular, it is preferable that the first substrate portion include the entire second substrate portion provided therein. With these configurations, the interface strength between the first substrate portion and the second substrate portion is improved, and joining of the first and second substrate portions to each other is realized with certainty even though both the first and second substrate portions have flexibility. In addition, oxidation resistance and the like of the second substrate portion is improved by protecting the second substrate portion with the first substrate portion.

It is preferable that the second substrate portion accommodate at least a portion of the first substrate portion. With this configuration, the first substrate portion is protected by the second substrate portion, and the water resistance and the like of the first substrate portion are improved, so that the electrode shape and the flexible circuit board shape are prevented from deteriorating.

It is preferable that the signal frequency in the second substrate portion be higher than the signal frequency in the first substrate portion. The higher the signal frequency, the larger the influence of the accuracy of the electrode shape and the accuracy of the flexible circuit board shape on the electrical characteristics, and thus, good electrical characteristics are able to be realized by setting the signal frequency in the second substrate portion, in which the accuracy of the electrode shape and the accuracy of the flexible circuit board shape is less likely to deteriorate, to be higher than the signal frequency in the first substrate portion.

It is preferable that the wiring density in the second substrate portion be higher than the wiring density in the first substrate portion. When wiring density is high, the line widths of wiring lines are small, and the pitch at which the wiring lines are arranged is narrow. Therefore, a connection failure of the wiring lines due to positional deviation of the wiring lines and the like at the time of manufacturing the flexible circuit board is likely to occur. However, the occurrence of the connection failure of the wiring lines due to the positional deviation of the wiring lines and the like at the time of manufacturing the flexible circuit board is able to be significantly reduced or prevented by setting the wiring density in the second substrate portion, in which the electrode shape and the flexible circuit board shape are able to be formed with high accuracy, to be higher than the wiring density in the first substrate portion.

It is preferable that only the second substrate portion include an active element. In an active element, external connection terminals, such as bumps, are arranged at a narrow pitch, and thus, there is a probability that a connection failure of wiring lines will occur due to the positional deviation of the external connection terminals and the like at the time of manufacturing the flexible circuit board. However, the occurrence of the connection failure of wiring lines in the active element is significantly reduced or prevented by providing the active element only in the second substrate portion, in which the electrode shape and the flexible circuit board shape are able to be formed with high accuracy.

It is preferable that the number of resin layers of the second substrate portion be larger than the number of resin layers of the first substrate portion. Since it is not necessary to use an adhesive to form the second substrate portion, the second substrate portion is able to have a small thickness, even if the number of resin layers of the second substrate portion is large. Therefore, a large number of circuit elements and wiring lines is disposed in the second substrate portion, and this configuration is effective for reducing the entire size of the flexible circuit board.

It is preferable that the thickness of the first substrate portion be smaller than the thickness of the second substrate portion. With this configuration, the first substrate portion is more likely to bend. Therefore, a larger stress sufficient to cause deformation of the flexible circuit board will be absorbed by the first substrate portion, and the occurrence of a failure such as fracture of the flexible circuit board or breaking of wiring lines is significantly reduced or prevented.

It is preferable that at least one of the first substrate portion and the second substrate portion be bent beforehand. With this configuration, the occurrence of a failure such as fracture of the flexible circuit board or breaking of wiring lines is significantly reduced or prevented.

It is preferable that the resin layers of the second substrate portion be made of a liquid crystal polymer resin. It is preferable that the resin layers of the first substrate portion be made of a polyimide. A liquid crystal polymer resin has thermoplasticity, and the resin layers made of a liquid crystal polymer resin are easily molecularly bonded together by heating the liquid crystal polymer resin. In addition, a liquid crystal polymer resin is a material that has a dissipation factor smaller than that of a polyimide and that transmits a signal with low loss, even if the signal frequency is high. Accordingly, a liquid crystal polymer resin is a suitable material out of which the second substrate portion is made. On the other hand, a polyimide is an inexpensive material and is more durable to repetitive deformation and deformation due to a large stress than a liquid crystal polymer resin. Accordingly, a polyimide is a suitable material out of which the first substrate portion is made.

According to various preferred embodiments of the present invention, the occurrence of a failure such as fracture of a flexible circuit board or breaking of wiring lines is significantly reduced or prevented by absorbing stress sufficient to cause deformation of the flexible circuit board by using a first substrate portion that includes a plurality of resin layers bonded together with an adhesive. In addition, good electrical characteristics of the flexible circuit board are able to be realized by ensuring accuracy of electrode shape and accuracy of the flexible circuit board shape by using a second substrate portion that includes a plurality of resin layers integrated with one another by intermolecular bonding.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Flexible circuit boards according to preferred embodiments of the present invention and methods of manufacturing the flexible circuit boards will be described below by taking a flexible circuit board used in a communication device as an example. Note that some conductor patterns and some circuit elements are not illustrated in the drawings, which are used in the following description, and only portions that are features of various preferred embodiments of the present invention are illustrated in the drawings.

Figure 1A:
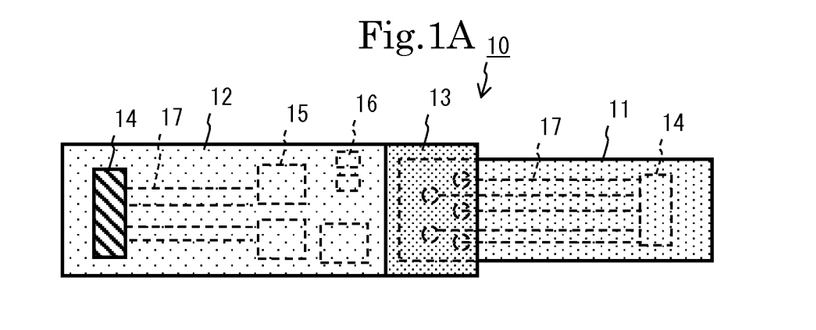
FIG. 1A is a plan view of a flexible circuit board according to a first preferred embodiment of the present invention.

First, a schematic configuration of a flexible circuit board 10 according to the first preferred embodiment of the present invention will be described. FIG. 1A is a plan view of the flexible circuit board 10 as viewed from one main surface thereof.

The flexible circuit board 10 includes a first substrate portion 11, a second substrate portion 12, a bonding resin 13, connectors 14, active elements 15, passive elements 16, and wiring lines 17.

The first substrate portion 11 preferably has a rectangular or substantially rectangular flat plate shape when a first main surface of the first substrate portion 11 is viewed in plan in the thickness direction of the first substrate portion 11 and is disposed on a first end side (right end side) of the flexible circuit board 10 in a left-right direction as viewed in FIG. 1A. The first substrate portion 11 is made of a polyimide. A polyimide is a material having high flexibility, and the thickness of the first substrate portion 11 in the vertical direction as viewed in FIG. 1A is set in such a manner that the entire first substrate portion 11 has flexibility. A polyimide is more resistant to repetitive deformation and deformation due to a large stress than a resin such as a liquid crystal polymer resin, and thus, a polyimide is a suitable material out of which the first substrate portion 11 is made. In addition, a polyimide is a material less expensive than a liquid crystal polymer. Furthermore, the first substrate portion 11 made of a polyimide has an advantage in that it can be manufactured at extremely low cost by bonding resin layers together with an adhesive. Note that other resin materials other than a polyimide may be used as the material of the first substrate portion 11.

The second substrate portion 12 preferably has a rectangular or substantially rectangular flat plate shape when a first main surface of the second substrate portion 12 is viewed in plan in the thickness direction of the second substrate portion 12 and is disposed on a second end side (left end side) of the flexible circuit board 10 in the left-right direction as viewed in FIG. 1A. The second substrate portion 12 is made of a liquid crystal polymer resin. A liquid crystal polymer resin is a material having high flexibility, and the thickness of the second substrate portion 12 in the vertical direction as viewed in FIG. 1A is set in such a manner that the entire second substrate portion 12 has flexibility. A liquid crystal polymer resin is a material having thermoplasticity and a property of softening with an increase in temperature, and the resin layers of the second substrate portion 12 are easily molecularly bonded together by heating the liquid crystal polymer resin. Accordingly, a liquid crystal polymer resin is a suitable material out of which the second substrate portion 12 is made. Note that other resin materials having thermoplasticity other than a liquid crystal polymer resin may be used as the material of the second substrate portion 12.

The first substrate portion 11 and the second substrate portion 12 extend in such a manner that their longitudinal directions are parallel to the left-right direction as viewed in FIG. 1A, and a second end portion (left end portion) of the first substrate portion 11 and a first end portion (right end portion) of the second substrate portion 12 are superposed with each other. The first substrate portion 11 and the second substrate portion 12 are electrically connected to each other in a region in which the first substrate portion 11 and the second substrate portion 12 are superposed with each other. Note that, although not illustrated, a resist film having an insulating property may be suitably provided on the first main surfaces and a second main surfaces of the first substrate portion 11 and the second substrate portion 12.

The bonding resin 13 is disposed in the vicinity of the region, in which the first substrate portion 11 and the second substrate portion 12 are superposed with each other. The bonding resin 13 is made of, for example, an epoxy resin and is bonded to the first substrate portion 11 and the second substrate portion 12. By providing the bonding resin 13, the interface strength between the first substrate portion 11 and the second substrate portion 12 is improved. Note that the bonding resin 13 need not be provided.

Each of the connectors 14 is mounted on one of the first main surfaces of the second substrate portion 12 and a second main surface of the first substrate portion 11. The connectors 14 define and function as external connection terminals of the flexible circuit board 10. Note that surface conductor patterns may be used instead of the connectors 14 so as to directly connect the first substrate portion 11 and the second substrate portion 12 to an external circuit.

The active elements 15 and the passive elements 16 are disposed within the second substrate portion 12. Each of the active elements 15 preferably is a semiconductor integrated circuit. The passive elements 16 preferably are chip elements, such as chip capacitors, chip inductors, and chip resistors, or pattern elements, such as capacitors, inductors, resistances that are defined by an internal conductor pattern of the second substrate portion 12.

The wiring lines 17 include an internal conductor pattern of the first substrate portion 11, the internal conductor pattern of the second substrate portion 12, a surface conductor pattern, and an interlayer connection conductor. The wiring lines 17 extend from the connector 14 of the first substrate portion 11 to the connector 14 of the second substrate portion 12 and are connected to the active elements 15 and the passive elements 16 in the second substrate portion 12.

Figure 1B:
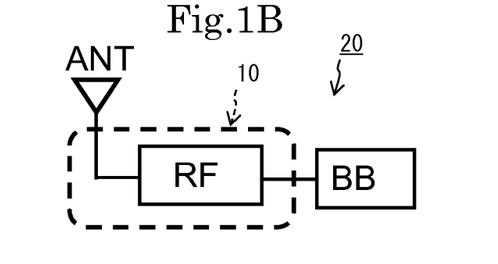
FIG. 1B is a schematic block diagram of a communication device that uses the flexible circuit board.

FIG. 1B is a schematic block diagram of a communication device 20 that includes the flexible circuit board 10. The communication device 20 includes an antenna ANT, a high-frequency circuit RF, and a base-band circuit BB. The high-frequency circuit RF is a circuit that is provided in or on the flexible circuit board 10 and is connected between the antenna ANT and the base-band circuit BB. The high-frequency circuit RF has a function of classifying signal lines, which propagate a transmission signal and a received signal, in accordance with frequency and a function of amplifying a transmission signal and a received signal between the antenna ANT and the base-band circuit BB.

Figure 1C:
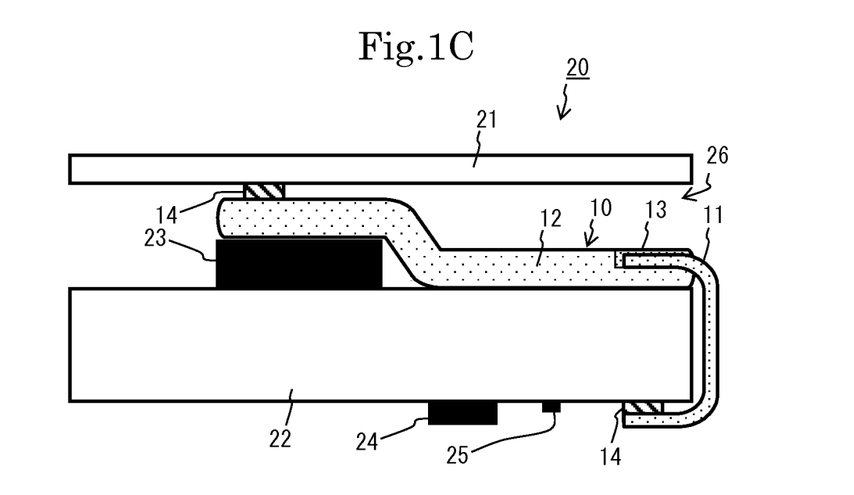
FIG. 1C is a partial sectional side view of the communication device.

FIG. 1C is a partial sectional side view of the communication device 20. The communication device 20 includes the flexible circuit board 10, an antenna-side substrate 21, a base-band circuit-side substrate 22, a battery pack 23, an active element 24, and a passive element 25.

The antenna-side substrate 21 is provided with the antenna ANT. The flexible circuit board 10 is provided with the high-frequency circuit RF. The base-band circuit-side substrate is provided with the base-band circuit BB. The active element 24 and the passive element 25 define a portion of the base-band circuit BB.

The antenna-side substrate 21 and the base-band circuit-side substrate 22 are disposed so as to face each other with a facing space 26 interposed therebetween. The battery pack 23 is mounted on the top surface of the base-band circuit-side substrate 22, that is, a surface of the base-band circuit-side substrate 22 that faces the antenna-side substrate 21, and is positioned in the facing space 26. The active element 24 and the passive element 25 are mounted on the bottom surface of the base-band circuit-side substrate 22.

As described above, in the flexible circuit board 10, both the first substrate portion 11 and the second substrate portion 12 have flexibility. In the flexible circuit board 10, the first substrate portion 11 and the second substrate portion 12 are mounted in a state of being bent between the antenna-side substrate 21 and the base-band circuit-side substrate 22 in the facing space 26.

More specifically, the second substrate portion 12 of the flexible circuit board 10 is connected to the bottom surface of the antenna-side substrate 21 via one of the connectors 14 at a position where the second substrate portion 12 faces the battery pack 23. The second substrate portion 12 extends, while being bent so as to follow the external shapes of the battery pack 23 and the base-band circuit-side substrate 22, to the vicinity of a side surface of the base-band circuit-side substrate 22 from the position at which the connector 14 is connected to the second substrate portion 12. The first substrate portion 11 of the flexible circuit board 10 is connected to the second substrate portion 12 in the vicinity of the side surface of the base-band circuit-side substrate 22. The first substrate portion 11 extends along the side surface of the base-band circuit-side substrate 22 to the bottom surface of the base-band circuit-side substrate 22 from the position at which the first substrate portion 11 is connected to the second substrate portion 12 and is connected to the bottom surface of the base-band circuit-side substrate 22 via the other one of the connectors 14. In this manner, the flexible circuit board 10 is connected between the antenna-side substrate 21 and the base-band circuit-side substrate 22 in a state where the first substrate portion 11 and the second substrate portion 12 are bent.

Note that the thickness of the first substrate portion 11 preferably is set to be smaller than the thickness of the second substrate portion 12, and the flexibility of the first substrate portion 11 preferably is higher than the flexibility of the second substrate portion 12. The second substrate portion 12 is bent beforehand. On the other hand, the first substrate portion 11 is deformed so as to change from a straight state to a bent state by a bending stress applied by the antenna-side substrate 21 and the base-band circuit-side substrate 22. The bend angle of the first substrate portion 11 is larger than the bend angle of the second substrate portion 12. As described above, the flexible circuit board 10 is bent beforehand, and the first substrate portion 11 is configured so as to be easier to bend than the second substrate portion 12. Therefore, the first substrate portion 11 absorbs a bending stress generated in the flexible circuit board 10 more than the second substrate portion 12 does, and a failure such as fracture of the flexible circuit board 10 or breaking of the wiring lines 17 is less likely to occur in the flexible circuit board 10.

Details of the configuration of the flexible circuit board 10 according to various preferred embodiments of the present invention will now be described with reference to a non-limiting example of a method of manufacturing of the flexible circuit board 10.

FIGS. 2A to 2D are sectional side views illustrating a portion of a process of manufacturing the flexible circuit board 10.

Figure 2A:
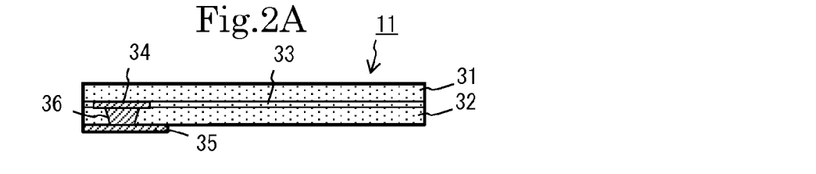
FIGS. 2A to 2D are sectional side views illustrating a process of manufacturing the flexible circuit board according to the first preferred embodiment of the present invention.

In the manufacture of the flexible circuit board 10, first, a first-substrate-portion-forming process, which is illustrated in FIG. 2A and through which the substrate portion 11 is formed, is performed.

More specifically, the first substrate portion 11 includes resin layers 31 and 32, an adhesive 33, an internal conductor pattern 34, a surface conductor pattern 35, and an interlayer connection conductor 36. The resin layers 31 and 32 are bonded together with the adhesive 33 in such a manner as to be stacked one on top of the other. The internal conductor pattern 34 is formed as a line conductor extending between the resin layers 31 and 32. The surface conductor pattern 35 is formed as a pad conductor that is connected to the internal conductor pattern 34 via the interlayer connection conductor 36.

In the first-substrate-portion-forming process, first, a plurality of polyimide films that serve as the resin layers 31 and 32 are prepared. As the polyimide films, polyimide films each having a metal film formed on one surface (or the two surfaces) thereof are used. A representative example of the metal film formed on each of such polyimide films is a copper foil. Patterning of the metal film of each of the polyimide films is performed by using a photolithography technique and an etching technique, so that conductor patterns that serve as the internal conductor pattern 34 and the surface conductor pattern 35 are formed. Next, an opening that does not extend through the conductor patterns and extends only through the polyimide films is formed by using a laser processing apparatus or the like. Then, the opening is filled with a conductive paste, and the conductive paste is metallized (sintered) in such a manner as to form the interlayer connection conductor 36. A representative example of the conductive paste is a material containing an alloy mainly composed of tin or silver and a binder. Next, the adhesive 33 such as a bonding sheet or a prepreg is provided on one surface of each of the plurality of polyimide films. In this case, it is preferable that, on each of the polyimide films, a conductive adhesive be provided at a position where the interlayer connection conductor 36 and the conductor patterns 34 and 35 are connected to one another, and that an adhesive having an insulating property be provided at other positions. It is also preferable that the adhesive 33 such as an anisotropic conductive sheet be provided. Note that it is desirable that the material of the adhesive 33 be a silicone-based material, a rubber-based material, an acrylic material, or the like that will have flexibility after being cured. The plurality of polyimide films are bonded together with the adhesive 33, so that the first substrate portion 11 is formed.

Figure 2B:
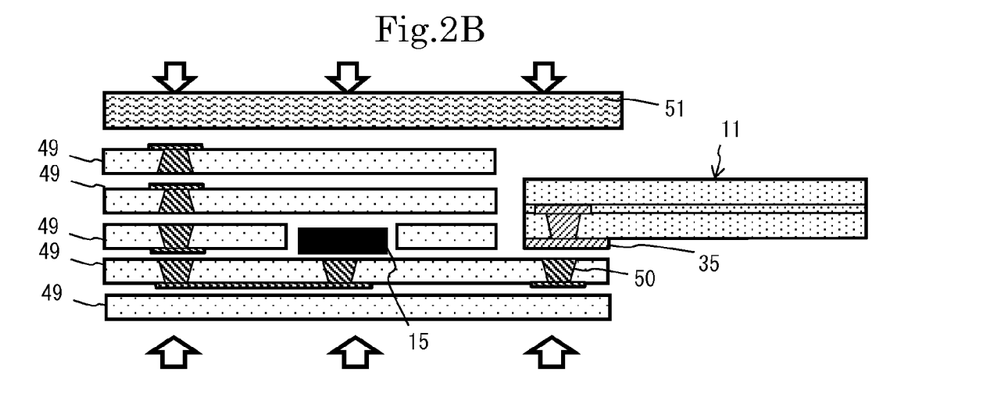

A second-substrate-portion-forming process, which is illustrated in FIG. 2B, is performed following the first-substrate-portion-forming process. The second-substrate-portion-forming process, which will be described below, includes a process of forming the second substrate portion 12 and a process of connecting the first substrate portion 11 and the second substrate portion 12 to each other. Note that these processes are not necessarily performed at the same time, and these processes may be performed in order as different processes.

Figure 2C:
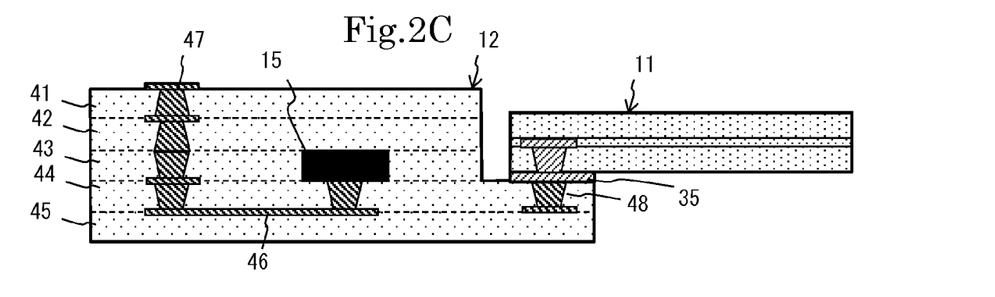

Note that the second substrate portion 12 that is formed through the second-substrate-portion-forming process has a configuration such as that illustrated in FIG. 2C. More specifically, the second substrate portion 12 includes resin layers 41, 42, 43, 44, and 45, internal conductor patterns 46, surface conductor patterns 47, and interlayer connection conductors 48. The resin layers 41, 42, 43, 44, and 45 are integrated with one another by intermolecular bonding of a thermoplastic resin. The internal conductor patterns 46 are formed as line conductors or pad conductors extending between the resin layers 41, 42, 43, 44, and 45. The surface conductor patterns 47 are formed as pad conductors that are connected to the internal conductor patterns 46 via the interlayer connection conductors 48.

In the second-substrate-portion-forming process, which is illustrated in FIG. 2B, first, a plurality of liquid crystal polymer resin films 49 that define as the resin layers 41, 42, 43, 44, and 45 are prepared. As the liquid crystal polymer resin films 49, liquid crystal polymer resin films each having a metal film formed on one surface (or the two surfaces) thereof are preferably used. A representative example of the metal film formed on each of the liquid crystal polymer resin films 49 is a copper foil. Patterning of the metal film of each of the liquid crystal polymer resin films 49 is performed by using a photolithography technique and an etching technique, so that conductor patterns that serve as the internal conductor patterns and the surface conductor patterns 47 are formed. Next, openings that do not extend through the conductor patterns and extend only through the liquid crystal polymer resin films 49 are formed by using a laser processing apparatus or the like, and the openings are filled with a conductive paste 50. Component-accommodating spaces in which the active elements 15 and the passive elements 16 are to be disposed are formed by die cutting or the like. Next, the plurality of liquid crystal polymer resin films 49 are superposed with one another in a state where the active elements 15 and the passive elements 16 are disposed in the corresponding component-accommodating spaces. Then, the liquid crystal polymer resin films 49 is softened by heating and applying pressure, which in turn leads to intermolecular bonding of the liquid crystal polymer resin. As a result, the plurality of liquid crystal polymer resin films 49 are integrated with one another in such a manner as to form the second substrate portion 12.

In this state, the conductive paste 50 provided in each of the liquid crystal polymer resin films 49 is metallized (sintered), so that the interlayer connection conductors 48 are formed. Note that the conductive paste 50 is exposed at one surface of each of the liquid crystal polymer resin films 49, and the conductive paste 50 of each of the liquid crystal polymer resin films 49 is brought into contact with the conductor pattern of a corresponding one of the liquid crystal polymer resin films 49 on which the liquid crystal polymer resin film 49 is to be stacked. Thus, in the liquid crystal polymer resin films 49, which are stacked on top of one another, the interlayer connection conductors 48 and the conductor patterns are directly joined to each other along with metallization of the conductive paste 50.

When the plurality of liquid crystal polymer resin films 49 are superposed with one another, heated, and pressurized, the conductive paste 50 (interlayer connection conductor 48) of one of the liquid crystal polymer resin films is directly joined to the surface conductor pattern (joint conductor) 35 of the first substrate portion 11. Since the material of the first substrate portion 11 and the material of the second substrate portion 12 are different from each other, the interface strength between the first substrate portion 11 and the second substrate portion 12 will not be improved by simply heating and pressurizing the first substrate portion 11 and the second substrate portion 12. However, by directly joining one of the interlayer connection conductors 48 to the surface conductor pattern 35, the first substrate portion 11 and the second substrate portion 12 are able to be joined to each other with a sufficient interface strength therebetween.

Note that when pressure is applied to the first substrate portion 11 and the second substrate portion 12, it is preferable that a cushion member 51 or the like be used in such a manner as to uniformly apply the pressure to the first substrate portion 11 and the second substrate portion 12 including a portion in which the first substrate portion 11 and the second substrate portion 12 are connected to each other.

Figure 2D:
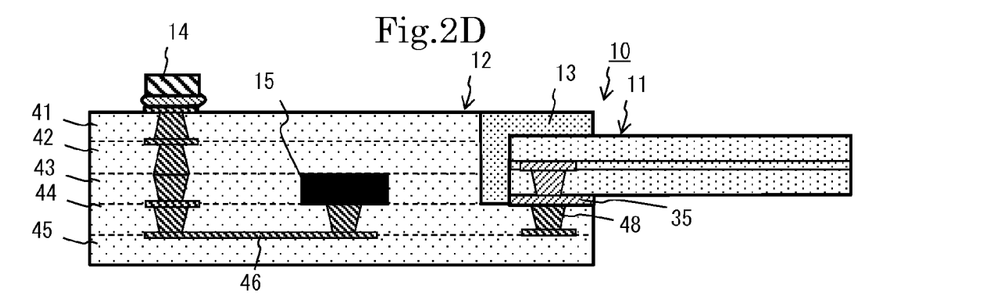

After the second-substrate-portion-forming process has been performed, as illustrated in FIG. 2D, the bonding resin 13 is disposed in the vicinity of the region in which the first substrate portion 11 and the second substrate portion 12 are superposed with each other, and the bonding between the first substrate portion 11 and the second substrate portion 12 is reinforced. The connectors 14 are bonded to a portion of the surface conductor pattern 35 of the first substrate portion 11 and a portion of one of the surface conductor patterns 47 of the second substrate portion 12 by using a bonding method in which a conductive adhesive, such as solder, is provided between the connectors 14 and these surface conductor patterns.

The flexible circuit board 10 according to the first preferred embodiment can be manufactured through the above-described non-limiting example of a manufacturing process. In the first substrate portion 11, which is included in the flexible circuit board 10, the plurality of resin layers 31 and are bonded together with the adhesive 33. Thus, the thicknesses of the resin layers 31 and 32 are small, and the first substrate portion 11 has durability higher than that of the second substrate portion 12, which has the configuration in which the plurality resin layers 41 to 45 are integrated with one another, and is less likely to fracture than the second substrate portion 12. In addition, since the adhesive 33 has a low modulus of elasticity, stress that acts on each of the resin layers 31 and 32 is reduced by the adhesive 33, and in addition, separation of the resin layers 31 and 32 from each other is less likely to occur. Therefore, in the case where deformation repeatedly occurs in the flexible circuit board 10 and in the case where deformation due to a large stress occurs in the flexible circuit board 10, the deformation is absorbed by the first substrate portion 11, and occurrence of a failure such as fracture of the first substrate portion 11 and the second substrate portion 12 or breaking of the wiring lines 17 is significantly reduced or prevented.

However, in the first substrate portion 11, the adhesive 33 may sometimes swell due to water absorption (moisture absorption) at interfaces between the resin layers 31 and 32 and the adhesive 33 and water absorption (moisture absorption) by the adhesive 33, and as a result, the accuracy of electrode shape and the accuracy of the shape of the flexible circuit board 10 may sometimes deteriorate. In addition, a property of the first substrate portion 11, such as the dielectric constant, may sometimes vary due to water absorption by the adhesive 33.

In contrast, in the second substrate portion 12, the plurality of resin layers 41 to 45 are integrated with one another by intermolecular bonding of the thermoplastic resin without providing an adhesive, such as a bonding sheet or a prepreg, between the resin layers 41 to 45. Thus, the second substrate portion 12 has better water resistance (moisture resistance) than that of the first substrate portion 11. In other words, the second substrate portion 12 absorbs only a small amount of water, and thus, in the flexible circuit board 10, highly accurate and stable shape of an electrode and highly accurate and stable shape of the flexible circuit board 10 are realized in the second substrate portion 12.

In the above-described configuration, since the active elements 15, which are included in the flexible circuit board 10, are semiconductor integrated circuits, a large number of external connection terminals, such as bumps, are arranged at a narrow pitch, and thus, in the flexible circuit board 10, the wiring density around the peripheries of the active elements 15 needs to be high for wiring connection to the external connection terminals of the active elements 15. Therefore, in the case where positional deviation of the conductor patterns and the like occur at the time of manufacturing the flexible circuit board 10, there is a probability that a connection failure of wiring lines and the active elements 15 and deterioration of the electrical characteristics due to positional deviation of the wiring lines and the like will occur. However, in the flexible circuit board 10, the active elements 15 are disposed in the second substrate portion 12, in which the electrode shape and the shape of the flexible circuit board 10 are formed with high accuracy, and thus, the connection failure of the wiring lines and the active elements 15 due to positional deviation of the wiring lines and the like at the time of manufacturing the flexible circuit board 10 and the deterioration of the electrical characteristics due to positional deviation of the wiring lines and the like are less likely to occur.

The liquid crystal polymer resin out of which the second substrate portion 12 is made, has a property such that its dissipation factor is smaller than that of the polyimide out of which the first substrate portion 11 is made. Thus, transmission loss of a high-frequency signal, which propagates through the high-frequency circuit RF, per unit distance is small in the second substrate portion 12 compared with the first substrate portion 11. Accordingly, in the flexible circuit board 10, all the active elements 15 and all the passive elements 16, which are included in the high-frequency circuit RF, are disposed in the second substrate portion 12, and as a result, the total length of the wiring lines 17 in the second substrate portion 12 is larger than that in the first substrate portion 11. As described above, since the total length of the wiring lines 17 in the second substrate portion 12, in which the transmission loss of the high-frequency signal is small, is set to be larger, the transmission loss of the high-frequency signal in the high-frequency circuit RF is significantly reduced, and good electrical characteristics are realized in the flexible circuit board 10.

The number of resin layers of the second substrate portion 12 is larger than the number of resin layers of the first substrate portion 11. As a result, a large number of circuit elements and wiring lines are able to be disposed in the second substrate portion 12. As described above, since the second substrate portion 12 is able to be formed without using an adhesive and is able to be formed so as to be thin, even if the second substrate portion 12 is multilayered, the flexible circuit board 10 is entirely reduced in size.

Note that, although the case where the joining and the electrical connection between the first substrate portion 11 and the second substrate portion 12 is realized by directly joining one of the interlayer connection conductors 48 and the surface conductor pattern 35 has been described above, the surface conductor pattern 35 and one of the surface conductor patterns 47 may be connected to each other by using a bonding method in which a conductive adhesive, such as solder, is provided between these surface conductor patterns. However, it is more desirable that a method of directly joining one of the interlayer connection conductors 48 and the conductor pattern 35 be used because, by using the method, the manufacturing process is simplified, and in addition, the thickness of a portion in which the first substrate portion 11 and the second substrate portion 12 are joined to each other is significantly reduced.

In addition, although the case where the joining and the electrical connection between the first substrate portion 11 and the second substrate portion 12 is realized by directly joining one of the interlayer connection conductors 48 of the second substrate portion 12 and the surface conductor pattern 35 of the first substrate portion 11 has been described above, contrary to this, an interlayer connection conductor may be provided in the first substrate portion 11, and the interlayer connection conductor and one of the surface conductor patterns 47 of the second substrate portion 12 may be directly joined to each other.

Furthermore, although the case where all the active elements 15 and all the passive elements 16 are disposed in the second substrate portion 12 has been described above, in other preferred embodiments, which will be described later, some of the plurality of active elements 15 and some of the plurality of passive elements 16 may be disposed in the first substrate portion 11 as long as a large number of the active elements 15 and a large number of the passive elements 16 are disposed in the second substrate portion 12. Alternatively, the second substrate portion 12 does not need to include the active elements 15 and the passive elements 16.

Furthermore, although the case where the antenna ANT and the base-band circuit BB are disposed outside the flexible circuit board 10 has been described above, the antenna ANT and the base-band circuit BB may be disposed in the flexible circuit board 10, and a communication circuit may be defined only by the flexible circuit board 10. Alternatively, the flexible circuit board 10 may define a different high-frequency circuit and may be used in other devices of the communication device 20.

A flexible circuit board according to a second preferred embodiment of the present invention will now be described. Note that, although features of the second preferred embodiment of the present invention will be described in detail in the following description, the rest of the configuration of the flexible circuit board according to the second preferred embodiment is similar to that of the flexible circuit board according to the first preferred embodiment, and detailed descriptions thereof will be omitted.

Figure 3A:
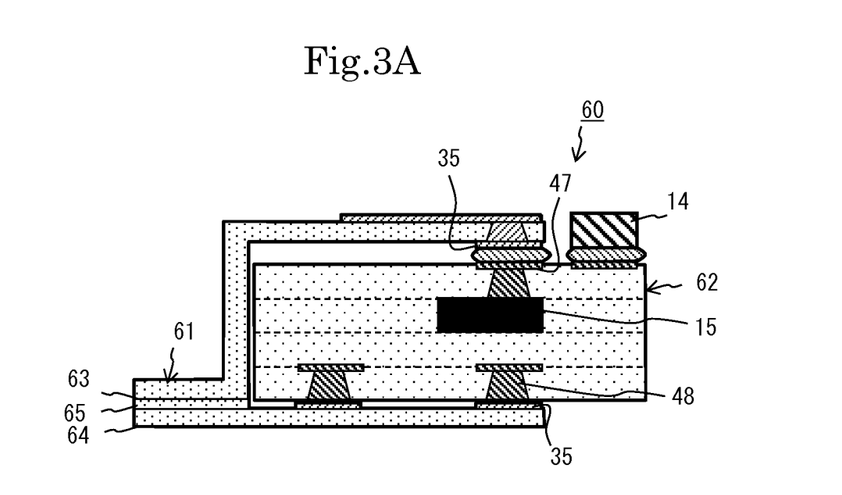
FIG. 3A is a sectional side view of a flexible circuit board according to a second preferred embodiment of the present invention.
Figure 3B:
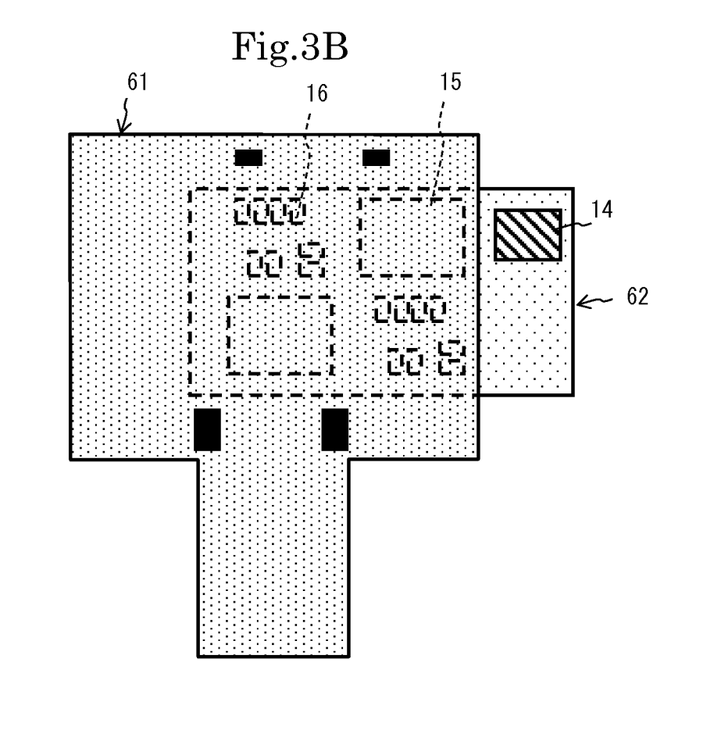
FIG. 3B is a plan view of the flexible circuit board.

FIG. 3A is a sectional side view of a flexible circuit board 60 according to the second preferred embodiment of the present invention. FIG. 3B is a plan view of the flexible circuit board 60.

The flexible circuit board 60 includes a first substrate portion 61 and a second substrate portion 62. One of the features of the second preferred embodiment is that a portion of the second substrate portion 62 is sandwiched between portions of the first substrate portion 61.

More specifically, the first substrate portion 61 includes resin layers 63 and 64, an adhesive 65, and surface conductor patterns 35, and a portion of the resin layer 63 and a portion of the resin layer 64 are not bonded together with the adhesive 65 and are separated from each other. The second substrate portion 62 is disposed between the resin layer 63 and the resin layer 64, which are separated from each other, and interface strength between the first substrate portion 61 and the second substrate portion 62 is improved as a result of the second substrate portion 62 being sandwiched between the resin layer 63 and the resin layer 64.

In the resin layer 64, one of the surface conductor patterns 35 is directly joined to an interlayer connection conductor 48 that is provided in the second substrate portion 62 as a result of metallization of a conductive paste. On the other hand, in the resin layer 63, the other one of the surface conductor patterns 35 is bonded to a surface conductor pattern 47, which is formed on the second substrate portion 62, with a conductive adhesive, such as solder, provided therebetween. Such a difference in the joining (bonding) method is dependent on the orientation of a surface of a liquid crystal polymer resin film, which is included in the second substrate portion 62, at which the conductive paste is exposed. Thus, the second substrate portion 62 may be formed in such a manner that the direct joining method utilizing metallization of a conductive paste is used on the two main surfaces of the second substrate portion 62 or may be formed in such a manner that the bonding method using a conductive adhesive, such as solder, is used on the two main surfaces of the second substrate portion 62.

The second substrate portion 62 and the first substrate portion 61 may each be provided with a mechanical dummy conductor (dummy electrode) that is to be used to improve interface strength, and the interface strength between the second substrate portion 62 and the first substrate portion 61 may be improved by joining the dummy conductors to each other.

A non-limiting example of a method of manufacturing the flexible circuit board 60 will be described below.

First, a multilayer body that is included in the second substrate portion 62 is formed by temporarily press-bonding liquid crystal polymer resin films and the like together. Then, the resin layers 63 and 64, which are included in the first substrate portion 61, are bonded together with the adhesive 65. However, the adhesive 65 is not applied to portions of the resin layers 63 and 64 that cover the multilayer body, which is included in the second substrate portion 62. Next, the surface conductor patterns 47 of the multilayer body, which is included in the second substrate portion 62, is bonded to the other one of the surface conductor patterns 35 of a polyimide film, which forms the resin layer 63, with solder or the like. Then, a polyimide film that forms the resin layer 64 is stacked on the polyimide film that forms the resin layer 63 in such a manner as to cover the multilayer body, which is included in the second substrate portion 62. Subsequently, the first substrate portion 61 and the second substrate portion 62 are formed at the same time by heating and applying pressure, and the interlayer connection conductors 48 of the second substrate portion 62 is directly joined to the one of the surface conductor patterns 35 of the polyimide film that forms the resin layer 64.

In the flexible circuit board 60, a highly accurate shape of an electrode and a highly accurate shape of the flexible circuit board 60 is realized by the second substrate portion 62 while improving durability by absorbing stress sufficient to cause deformation of the flexible circuit board 60 by using the first substrate portion 61. In addition, by using the configuration in which the second substrate portion 62 is sandwiched between the resin layers 63 and 64 of the first substrate portion 61, the joining of the first substrate portion 61 and the second substrate portion 62 to each other is realized with certainty even though both the first substrate portion 61 and the second substrate portion 62 have flexibility.

A flexible circuit board according to a third preferred embodiment of the present invention will now be described. Note that, although features of the third preferred embodiment of the present invention will be described in detail in the following description, the rest of the configuration of the flexible circuit board according to the third preferred embodiment is similar to that of the flexible circuit board according to the first preferred embodiment, and detailed descriptions thereof will be omitted.

Figure 4A:
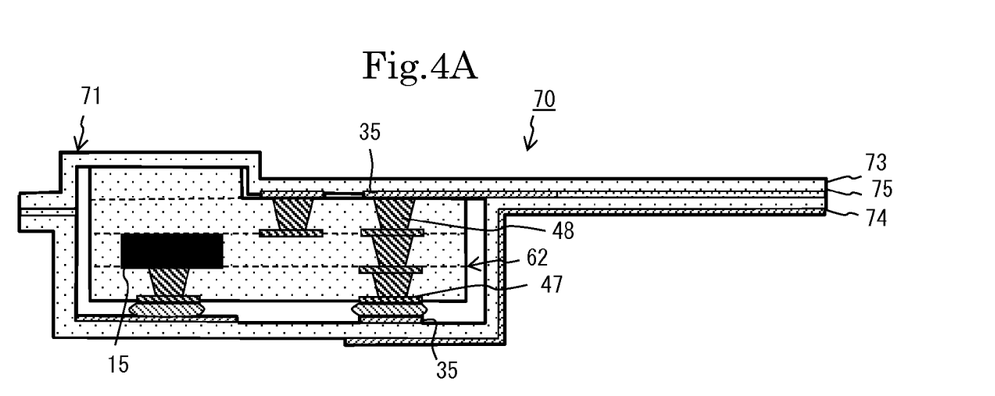
FIG. 4A is a sectional side view of a flexible circuit board according to a third preferred embodiment of the present invention.
Figure 4B:
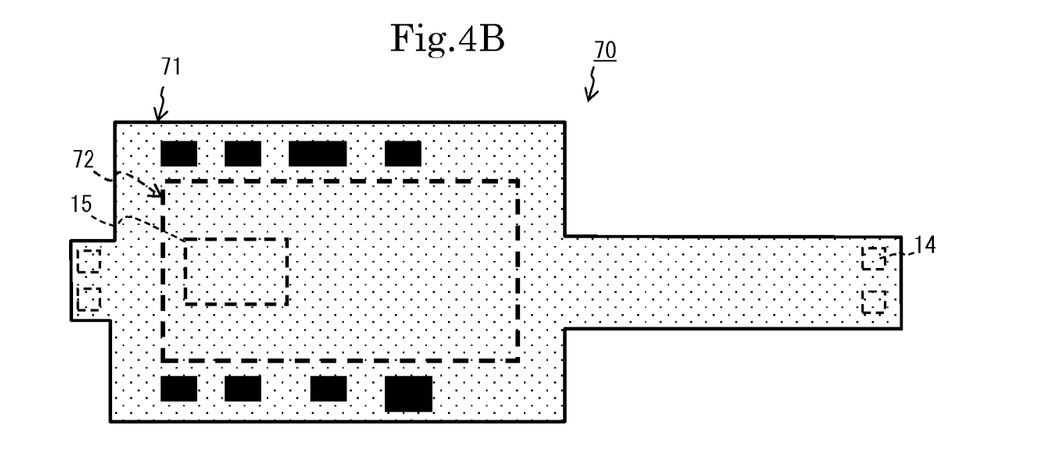
FIG. 4B is a plan view of the flexible circuit board.

FIG. 4A is a sectional side view of a flexible circuit board 70 according to the third preferred embodiment of the present invention. FIG. 4B is a plan view of the flexible circuit board 70.

The flexible circuit board 70 includes a first substrate portion 71 and a second substrate portion 72. One of the features of the third preferred embodiment is that the entire second substrate portion 72 is enclosed by the first substrate portion 71.

More specifically, the first substrate portion 71 includes resin layers 73 and 74, an adhesive 75, and surface conductor patterns 35. A portion of the resin layer 73 and a portion of the resin layer 74 are separated from each other in a region inside the first substrate portion 71 and not bonded together with the adhesive 75. The second substrate portion 72 is disposed in a region defined by the portions of the resin layer 73 and the resin layer 74, which are separated from each other, and enclosed by the resin layer 73 and the resin layer 74. As described above, the second substrate portion 72 is provided in the first substrate portion 71, and the interface strength between the first substrate portion 71 and the second substrate portion 72 is improved.

In the flexible circuit board 70, which has the above-described configuration, a highly accurate shape of an electrode and a highly accurate shape of the flexible circuit board 70 is realized by the second substrate portion 72 while improving durability by absorbing stress sufficient to cause deformation of the flexible circuit board 70 by using the first substrate portion 71. In addition, oxidation resistance and the like of the second substrate portion 72 is improved by protecting the entire second substrate portion 72 with the first substrate portion 71.

A flexible circuit board 80 according to a fourth preferred embodiment of the present invention will now be described. Note that, although features of the fourth preferred embodiment of the present invention will be described in detail in the following description, the rest of the configuration of the flexible circuit board 80 according to the fourth preferred embodiment is similar to that of the flexible circuit board according to the first preferred embodiment, and detailed descriptions thereof will be omitted.

Figure 5A:
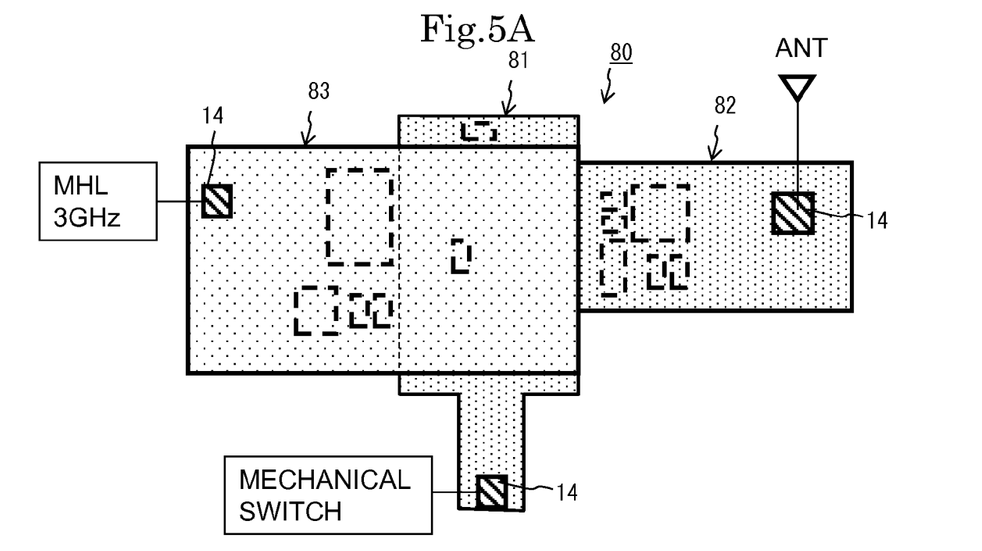
FIG. 5A is a plan view of a flexible circuit board according to a fourth preferred embodiment of the present invention.
Figure 5B:
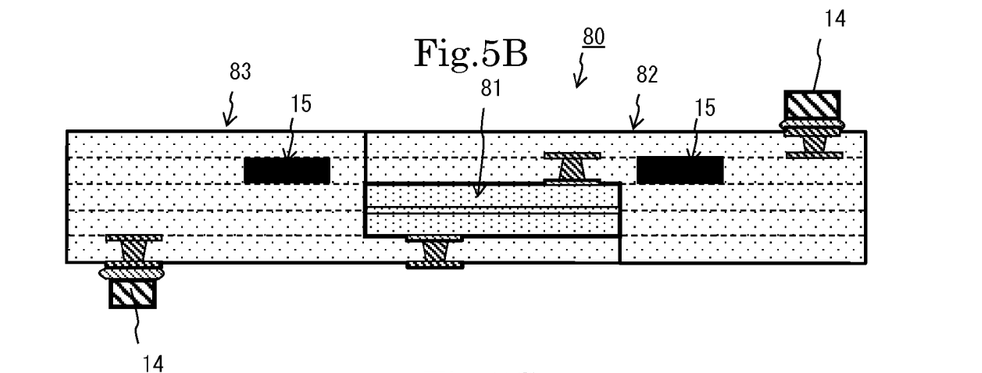
FIG. 5B is a sectional side view of the flexible circuit board.
Figure 5C:
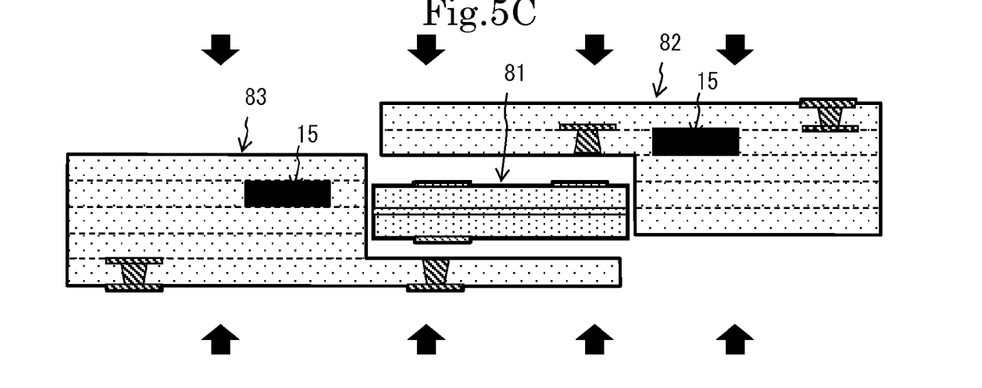
FIG. 5C is a sectional side view illustrating a process of manufacturing the flexible circuit board.

FIG. 5A is a plan view of the flexible circuit board 80 according to the fourth preferred embodiment of the present invention. FIG. 5B is a sectional side view of the flexible circuit board 80. FIG. 5C is a sectional side view illustrating a process of manufacturing the flexible circuit board 80.

The flexible circuit board 80 includes a first substrate portion 81 and second substrate portions 82 and 83. One of the features of the fourth preferred embodiment is that the first substrate portion 81 is sandwiched between the second substrate portions 82 and 83 each of which is made of a liquid crystal polymer resin.

More specifically, as illustrated in FIG. 5B and FIG. 5C, the second substrate portion 82 and the second substrate portion 83 are each formed in an L shape when viewed from the side. In addition, the second substrate portion 82 and the second substrate portion 83 are heated and pressurized in such a manner that the two surfaces of the first substrate portion 81 are sandwiched between the second substrate portion 82 and the second substrate portion 83 as illustrated in FIG. 5C, so that the second substrate portion 82 and the second substrate portion 83 are joined to the first substrate portion 81.

The second substrate portion 82 is provided with a high-frequency circuit, which is not illustrated, and the high-frequency circuit is connected to an external antenna ANT or the like via a connector 14. The second substrate portion 83 is provided with a video output generation circuit (mobile high-definition link (MHL) signal generation circuit), which is not illustrated, and the video output generation circuit is connected to an external MHL signal processing circuit via another connector 14. The first substrate portion 81 is provided with a low-frequency circuit, such as an audio-output-level-control circuit, and the low-frequency circuit is connected to an external mechanical switch to control audio output level or the like via another connector 14. The wiring density in the second substrate portion 82 and the wiring density in the second substrate portion 83 are each set to be higher than the wiring density in the first substrate portion 81.

In the flexible circuit board 80, which has the above-described configuration, the durability and reliability of the flexible circuit board 80 are improved by providing the audio-output-level-control circuit or the like, to which vibration from the outside is likely to be transmitted, in the first substrate portion 81. In addition, the first substrate portion is protected by the second substrate portions 82 and 83 by causing the first substrate portion 81 to be sandwiched between the second substrate portions 82 and 83, so that the water resistance and the like of the first substrate portion 81 is improved, and as a result, electrode shape and the shape of the flexible circuit board 80 are prevented from deteriorating due to water absorption of the first substrate portion 81.

The high-frequency circuit, through which a signal of a high signal frequency propagates, and the video output generation circuit are respectively provided in the second substrate portions 82 and 83, each of which is made of a liquid crystal polymer resin and each of which has a small dissipation factor, and the low-frequency circuit through which a signal of a low signal frequency propagates, is provided in the first substrate portion 81, which is made of a polyimide and which has a large dissipation factor. As a result, the electrical characteristics of the high-frequency circuit and the video output generation circuit are prevented from deteriorating, and good electrical characteristics of the high-frequency circuit and the video output generation circuit are realized.

Since the wiring density in each of the second substrate portions 82 and 83, in which the electrode shape and the shape of the flexible circuit board 80 are formed with high accuracy, is higher than the wiring density in the first substrate portion 81, and thus, even in the case where the line widths of wiring lines are small, and the pitch at which the wiring lines are arranged is narrow in the second substrate portions 82 and 83, the occurrence of a connection failure of the wiring lines due to positional deviation of the wiring lines and the like at the time of manufacturing the flexible circuit board 80 is significantly reduced or prevented.

Although the case where the first substrate portion is made of a polyimide, and the second substrate portion is made of a liquid crystal polymer resin has been described in the above preferred embodiments, both the first and second substrate portions may be made of a thermoplastic resin such as a liquid crystal polymer resin. In other words, the first substrate portion may be formed by bonding thermoplastic resin films made of a liquid crystal polymer resin or the like together with an adhesive.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible circuit board comprising:
a first substrate portion; and
a second substrate portion; wherein
the first substrate portion and the second substrate portion are adjacent to each other and electrically connected to each other in a planar direction of the flexible circuit board;
the first substrate portion includes a plurality of resin layers, which are bonded together with an adhesive, and has flexibility;
the second substrate portion includes a plurality of resin layers, which are stacked on top of one another and integrated with one another by intermolecular bonding of a thermoplastic resin, and has flexibility;
the second substrate portion includes a space that accommodates at least a portion of the first substrate portion;
in a stacking direction in which the plurality of resin layers of the second substrate portion are stacked, a dimension of the space is greater than or equal to a dimension of the portion of the first substrate portion that is accommodated in the space; and
both the first substrate portion and the second substrate portion include a bending portion.

2. The flexible circuit board according to claim 1, wherein
at least one of the first substrate portion and the second substrate portion includes an interlayer connection conductor extending through the resin layer; and
at least another one of the first substrate portion and the second substrate portion includes a joint conductor that is directly joined to the interlayer connection conductor.

3. The flexible circuit board according to claim 1, further comprising a bonding resin that is bonded to at least a portion of the first substrate portion and at least a portion of the second substrate portion.

4. The flexible circuit board according to claim 1, wherein the plurality of resin layers of the second substrate portion are greater than the plurality of resin layers of the first substrate portion.

5. The flexible circuit board according to claim 1, wherein a thickness of the first substrate portion is smaller than a thickness of the second substrate portion.

6. The flexible circuit board according to claim 1, wherein a bend angle of the first substrate portion is larger than a bend angle of the second substrate portion.

7. The flexible circuit board according to claim 1, wherein the resin layers of the second substrate portion are made of a liquid crystal polymer resin.

8. The flexible circuit board according to claim 1, wherein the resin layers of the first substrate portion are made of a polyimide.

9. The flexible circuit board according to claim 1, wherein the second substrate portion is provided with an active element, and the first substrate portion is not provided with an active element.

10. A flexible circuit board comprising:
a first substrate portion; and
a second substrate portion; wherein
the first substrate portion and the second substrate portion are adjacent to each other and electrically connected to each other in a planar direction of the flexible circuit board;
the first substrate portion includes a plurality of resin layers, which are bonded together with an adhesive, and has flexibility;
the second substrate portion includes a plurality of resin layers, which are stacked on top of one another and integrated with one another by intermolecular bonding of a thermoplastic resin, and has flexibility;
the second substrate portion includes a space that accommodates at least a portion of the first substrate portion;
in a stacking direction in which the plurality of resin layers of the second substrate portion are stacked, a dimension of the space is greater than or equal to a dimension of the portion of the first substrate portion that is accommodated in the space; and
the second substrate portion is configured to be connected to an antenna.

11. The flexible circuit board according to claim 10, wherein
at least one of the first substrate portion and the second substrate portion includes an interlayer connection conductor extending through the resin layer; and
at least another one of the first substrate portion and the second substrate portion includes a joint conductor that is directly joined to the interlayer connection conductor.

12. The flexible circuit board according to claim 10, further comprising a bonding resin that is bonded to at least a portion of the first substrate portion and at least a portion of the second substrate portion.

13. The flexible circuit board according to claim 10, wherein the plurality of resin layers of the second substrate portion are greater than the plurality of resin layers of the first substrate portion.

14. The flexible circuit board according to claim 10, wherein a thickness of the first substrate portion is smaller than a thickness of the second substrate portion.

15. The flexible circuit board according to claim 10, wherein
the first substrate portion and the second substrate portion are bent; and
a bend angle of the first substrate portion is larger than a bend angle of the second substrate portion.

16. The flexible circuit board according to claim 10, wherein the resin layers of the second substrate portion are made of a liquid crystal polymer resin.

17. The flexible circuit board according to claim 10, wherein the resin layers of the first substrate portion are made of a polyimide.

18. The flexible circuit board according to claim 10, wherein the second substrate portion is provided with an active element, and the first substrate portion is not provided with an active element.

19. A device comprising:
a flexible circuit board including:
a first substrate portion; and
a second substrate portion;
a first circuit board; and
a second circuit board; wherein
the first substrate portion and the second substrate portion are adjacent to each other and electrically connected to each other in a planar direction of the flexible circuit board;
the first substrate portion includes a plurality of resin layers, which are bonded together with an adhesive, and has flexibility;
the second substrate portion includes a plurality of resin layers, which are stacked on top of one another and integrated with one another by intermolecular bonding of a thermoplastic resin, and has flexibility;
the second substrate portion includes a space that accommodates at least a portion of the first substrate portion;
in a stacking direction in which the plurality of resin layers of the second substrate portion are stacked, a dimension of the space is greater than or equal to a dimension of the portion of the first substrate portion that is accommodated in the space;
both the first substrate portion and the second substrate portion include a bending portion; and
the first substrate portion is connected to the first circuit board, the second substrate portion is connected to the second circuit board, and the first circuit board and the second circuit board are connected to each other through the flexible circuit board.

20. The device according to claim 19, wherein
at least one of the first substrate portion and the second substrate portion includes an interlayer connection conductor extending through the resin layer; and
at least another one of the first substrate portion and the second substrate portion includes a joint conductor that is directly joined to the interlayer connection conductor.

21. The device according to claim 19, wherein the second substrate portion is provided with an active element, and the first substrate portion is not provided with an active element.

22. A device comprising:
a flexible circuit board including:
a first substrate portion; and
a second substrate portion;
a first circuit board; and
a second circuit board; wherein
the first substrate portion and the second substrate portion are adjacent to each other and electrically connected to each other in a planar direction of the flexible circuit board;
the first substrate portion includes a plurality of resin layers, which are bonded together with an adhesive, and has flexibility;
the second substrate portion includes a plurality of resin layers, which are stacked on top of one another and integrated with one another by intermolecular bonding of a thermoplastic resin, and has flexibility;
the second substrate portion includes a space that accommodates at least a portion of the first substrate portion;
in a stacking direction in which the plurality of resin layers of the second substrate portion are stacked, a dimension of the space is greater than or equal to a dimension of the portion of the first substrate portion that is accommodated in the space;

the second substrate portion is configured to be connected to an antenna; and the first substrate portion is connected to the first circuit board, the second substrate portion is connected to the second circuit board, the second circuit board includes the antenna, and the first circuit board and the second circuit board are connected to each other through the flexible circuit board.

23. The device according to claim 22, wherein at least one of the first substrate portion and the second substrate portion includes an interlayer connection conductor extending through the resin layer; and at least another one of the first substrate portion and the second substrate portion includes a joint conductor that is directly joined to the interlayer connection conductor.

24. The device according to claim 22, wherein the second substrate portion is provided with an active element, and the first substrate portion is not provided with an active element.

* * * * *